: US 7,936,445 B2

(12) United States Patent
Hintersteiner et al.

(10) Patent No.: US 7,936,445 B2
(45) Date of Patent: May 3, 2011

(54) ALTERING PATTERN DATA BASED ON MEASURED OPTICAL ELEMENT CHARACTERISTICS

(75) Inventors: Jason D. Hintersteiner, Norwalk, CT (US); Wenceslao A. Cebuhar, Norwalk, CT (US); Patricius Aloysius Jacobus Tinnemans, Hapert (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 131 days.

(21) Appl. No.: 11/454,803

(22) Filed: Jun. 19, 2006

(65) Prior Publication Data

US 2007/0291240 A1 Dec. 20, 2007

(51) Int. Cl.
*G03B 27/54* (2006.01)
(52) U.S. Cl. ............................................ 355/67; 355/52
(58) Field of Classification Search .............. 355/52, 355/67
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,057,639 A | 5/2000 | May et al. | |
| 6,133,986 A | 10/2000 | Johnson | |
| 6,177,980 B1 | 1/2001 | Johnson | |
| 6,238,852 B1 | 5/2001 | Klosner | |
| 6,247,037 B1 | 6/2001 | O'Callaghan | |
| 6,256,086 B1 * | 7/2001 | Sumiyoshi | 355/55 |
| 6,312,134 B1 | 11/2001 | Jain et al. | |
| 6,399,261 B1 | 6/2002 | Sandstrom | |
| 6,424,388 B1 | 7/2002 | Colgan et al. | |
| 6,428,940 B1 | 8/2002 | Sandstrom | |
| 6,498,685 B1 | 12/2002 | Johnson | |

(Continued)

FOREIGN PATENT DOCUMENTS

JP  2002-367900 A  12/2002

(Continued)

OTHER PUBLICATIONS

Azat Latypov, U.S. Appl. No. 11/340,865, filed Jan. 27, 2006, entitled "Method and system for a maskless lithography rasterization technique based on global optimization".

(Continued)

*Primary Examiner* — Edward J Glick
*Assistant Examiner* — Mesfin T Aslaw
(74) *Attorney, Agent, or Firm* — Sterne, Kessler, Goldstein & Fox P.L.L.C

(57) ABSTRACT

A system and method are used to compensate for distortions or aberrations in an image formed in a projection system. Pattern data is generated corresponding to features to be formed on a substrate. At least one of aberrations and distortions of a projection optical system are measured. The pattern data is altered based on the measuring step. The altered pattern data is transmitted to a patterning device to control individually controllable elements coupled to the patterning device. Non uniformities in one or both of a field and pupil of an illumination system can also be measured and used to alter the pattern data.

31 Claims, 9 Drawing Sheets

U.S. PATENT DOCUMENTS

| | | |
|---|---|---|
| 6,624,880 B2 | 9/2003 | Sandstrom et al. |
| 6,687,041 B1 | 2/2004 | Sandstrom |
| 6,707,534 B2 | 3/2004 | Bjorklund et al. |
| 6,717,650 B2 | 4/2004 | Jain |
| 6,747,783 B1 | 6/2004 | Sandstrom |
| 6,764,796 B2 | 7/2004 | Fries |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,819,469 B1 | 11/2004 | Koba |
| 6,833,854 B1 | 12/2004 | Sandstrom |
| 6,841,787 B2 | 1/2005 | Almogy |
| 6,876,440 B1 | 4/2005 | Bleeker et al. |
| 6,956,692 B2 | 10/2005 | Duerr et al. |
| 6,963,434 B1 | 11/2005 | Latypov |
| 6,992,754 B2 | 1/2006 | Bleeker et al. |
| 7,012,674 B2 | 3/2006 | Sewell |
| 7,061,226 B2 | 6/2006 | Durr |
| 7,061,591 B2 | 6/2006 | Bleeker et al. |
| 7,063,920 B2 | 6/2006 | Baba-Ali |
| 7,094,506 B2 | 8/2006 | Van Buel |
| 7,102,733 B2 | 9/2006 | Latypov et al. |
| 7,106,490 B2 | 9/2006 | Sandstrom |
| 7,110,082 B2 | 9/2006 | Smirnov et al. |
| 7,153,616 B2 | 12/2006 | Mason |
| 7,170,669 B1 | 1/2007 | Jain et al. |
| 7,212,225 B2 | 5/2007 | Sumi et al |
| 7,215,409 B2 | 5/2007 | Sandstrom |
| 7,369,291 B2 | 5/2008 | Karlin |
| 7,469,058 B2 | 12/2008 | Latypov et al. |
| 2002/0008863 A1* | 1/2002 | Taniguchi et al. ............. 355/55 |
| 2002/0021426 A1 | 2/2002 | Mei et al. |
| 2002/0080338 A1* | 6/2002 | Taniguchi ...................... 355/67 |
| 2003/0142410 A1* | 7/2003 | Miyake ......................... 359/619 |
| 2003/0206281 A1 | 11/2003 | Jain |
| 2003/0210383 A1 | 11/2003 | Bjorklund et al. |
| 2004/0041104 A1 | 3/2004 | Liebregts et al. |
| 2004/0075882 A1* | 4/2004 | Meisburger .................. 359/290 |
| 2004/0130561 A1 | 7/2004 | Jain |
| 2004/0135965 A1 | 7/2004 | Holmes |
| 2004/0239908 A1 | 12/2004 | Bleeker et al. |
| 2005/0007572 A1 | 1/2005 | George et al. |
| 2005/0007677 A1 | 1/2005 | Coston et al. |
| 2005/0024613 A1 | 2/2005 | Bleeker |
| 2005/0046819 A1 | 3/2005 | Bleeker et al. |
| 2005/0068467 A1 | 3/2005 | Bleeker et al. |
| 2005/0168791 A1* | 8/2005 | Latypov et al. ............... 359/239 |
| 2005/0211919 A1 | 9/2005 | Galburt et al. |

FOREIGN PATENT DOCUMENTS

| | | |
|---|---|---|
| JP | 2003-140270 A | 5/2003 |
| JP | 2004-319899 A | 11/2004 |
| JP | 2004-363598 A | 12/2004 |
| WO | WO 98/04950 A1 | 2/1998 |
| WO | WO 98/33096 | 7/1998 |
| WO | WO 98/38597 | 9/1998 |
| WO | WO 2006/083685 A2 | 8/2006 |

OTHER PUBLICATIONS

Sandstrom, Tor, Arno Bleeker, Jason D. Hintersteiner, and Kars Troost. "OML: Optical Maskless Lithography for Economic Design Prototyping and Small-Volume Production". Proceedings of SPIE, vol. 5377. Optical Microlithography XVII: May 2004. pp. 777-787.

Azat Latypov, Ronald Albright, Nabila BabaAli, Wenceslao A. Cebuhar, Jason D. Hintersteiner, and Elizabeth Stone; "Optical Rasterization Algorithms for Contrast Devices Utilizing Different Physical Modulation Principles in Optical Maskless Lithography," Emerging Lithographic Technologies IX, edited by R. Scott Mackay, Proceedings of SPIE vol. 5751, pp. 1038-1049, (SPIE, Bellingham, WA, 2005).

Shroff, et al., "Image Optimization for Maskless Lithography", Emerging Lithographic Technologies VIII, Proceedings of SPIE vol. 5374, 2004, pp. 637-647.

Notification of Reasons for Refusal mailed Sep. 7, 2010 for Japanese Patent Application No. 2007-160009, 3 pgs.

* cited by examiner

ALTERING PATTERN DATA BASED ON MEASURED OPTICAL ELEMENT CHARACTERISTICS

CROSS REFERENCE TO RELATED APPLICATIONS

This application is related to U.S. application Ser. No. 11/340,865, filed Jan. 27, 2006, which is incorporated by reference herein in its entirety.

BACKGROUND

1. Field of the Invention

The present invention generally relates to the field of maskless lithography (MLL) and optical maskless lithography (OML).

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of an integrated circuit, flat panel display, or other device. This pattern can be transferred onto all or part of the substrate (e.g., a glass plate, wafer, etc.), by imaging onto a layer of radiation-sensitive material (e.g., resist) provided on the substrate. Instead of a circuit pattern, the patterning device can be used to generate other patterns, for example a color filter pattern or a matrix of dots.

Instead of a mask, the patterning device can comprise a patterning array that comprises an array of individually controllable elements (e.g., pixels of the patterning device). The pattern can be changed more quickly and for less cost in such a system compared to a mask-based system.

A flat panel display substrate is typically rectangular in shape. A substrate for integrated circuit application is typically circular in shape. Lithographic apparatuses designed to expose substrate of these types can provide an exposure region that covers a full width of the substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, a small portion of the width of the substrate, then the substrate can be moved transversely after the first scan, and further scans are typically performed to expose the remainder of the substrate.

Optical rasterization is a technique that uses a description of a desired pattern to be printed (e.g., a graphic design system (GDSII mask file)), to compute states (e.g., pixel transmittance or pixel micro-mirror tilt or piston) of the patterning device pixels that will reproduce the pattern at an optical image plane. In maskless lithography, rasterization is a technique used to form pattern data, which is used by a pattern controller to control the patterning device. For example, controlling the patterning device can include moving individual controllable elements that are associated with the patterning device, e.g., mirrors.

In various examples, rasterization is performed by taking a desired pattern and Fourier transforming the pattern to determine what the pattern would look like in the pupil or the image plane of projection optics. Pattern data correlated to this determination is generated and transmitted along a datapath to the pattern controller. An algorithm matches performance of the patterning device to the pattern data to produce control signals that are used to form a pattern on the patterning device to pattern incoming illumination. The projection system directs the patterned light to reproduce the desired image at the pupil of the projection system.

However, rasterization is usually performed assuming, the projection system includes perfect optical elements. Unfortunately, in most projection systems, the optical elements contain minor imperfections, which can produce certain aberrations and/or distortions in the projection system. These aberrations and/or distortions can effect the actual image formed in the projection system, sometimes enough to cause errors in the features formed on the substrate. In addition, rasterization generally assumes that the illumination light reaching the pattern generation system is completely uniform, and any illumination profile is perfectly defined. Unfortunately, most illumination systems contain minor imperfections that can cause the beam to be non-uniform or the illumination profile to be slightly misshaped, resulting in errors in the features formed on the substrate.

Therefore, what is needed is a system and method that compensates for aberrations and/or distortions in an image formed in a projection system, as well as illumination pupil fill and field uniformity imperfections, by accounting for such imperfections by altering the pattern data generated to control a patterning device.

SUMMARY

In one embodiment of the present invention, there is provided a method comprising the following steps. Pattern data is generated that corresponds to features to be formed on a substrate. Aberrations and/or distortions of a projection optical system are measured. The pattern data is altered based on the measuring step. The altered pattern data is transmitted to a patterning device to control individually controllable elements coupled to the patterning device.

Additionally, or alternatively, non uniformities in one or both of an illumination field and pupil of an illumination system can be measured and used to alter the pattern data.

In another embodiment of the present invention, there is provided a lithographic system comprising an illumination system, a patterning device, a projection system, and a measuring system. The illumination system processes a beam of radiation. The patterning device includes a controller and an array of individually controllable elements. The controller is configured to control the array of individually controllable elements based on receiving pattern data to pattern the beam of radiation. The projection system projects the patterned beam onto a target portion of a substrate. The measuring system is configured to measure aberrations and/or distortions of the projection system. The controller uses the measured aberrations or distortions to alter the pattern data.

Additionally, or alternatively, non uniformities in one or both of an illumination field and pupil of an illumination system can be measured and used to alter the pattern data.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
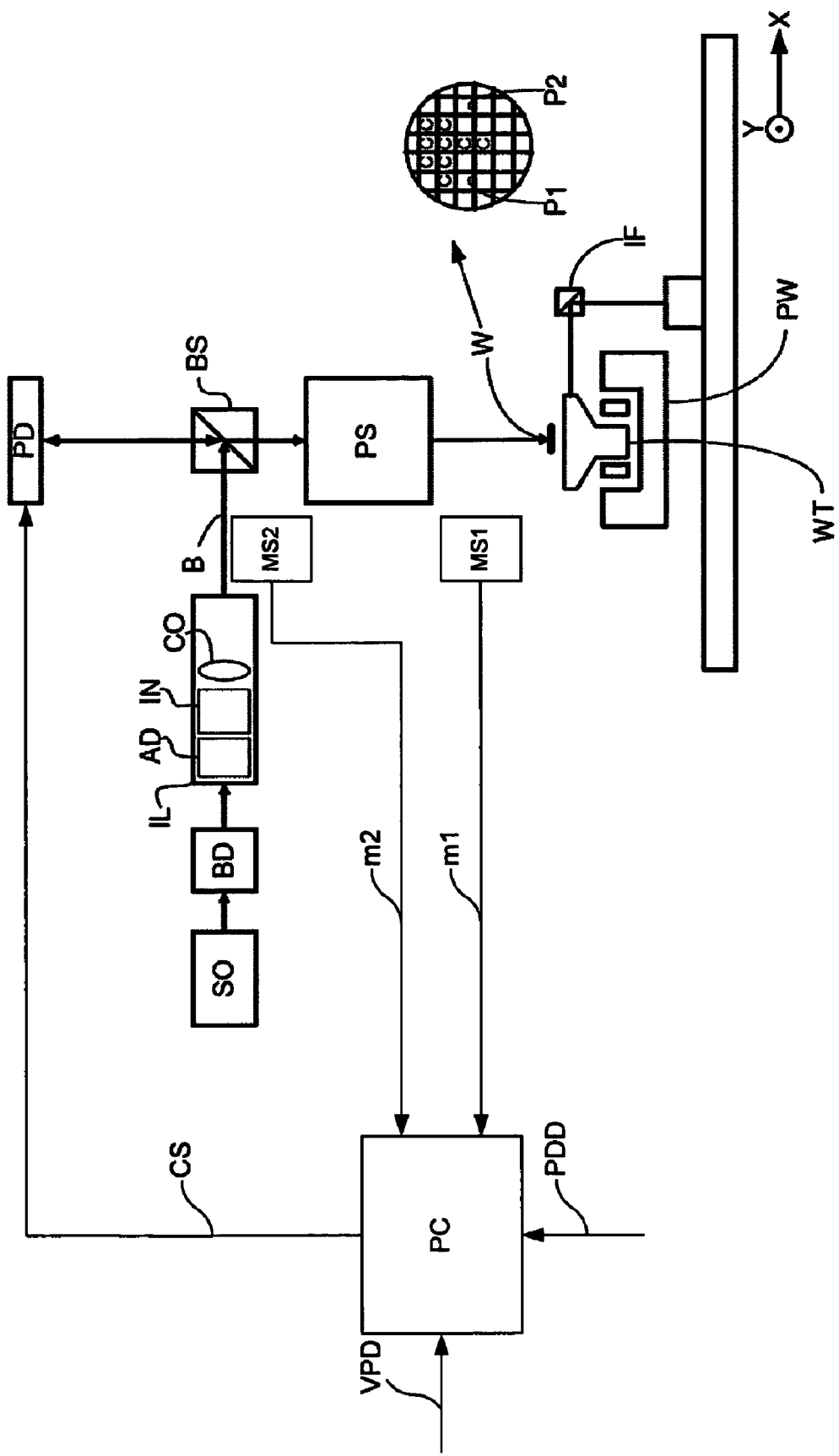
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus of one embodiment of the invention. The apparatus comprises an illumination system IL, a patterning device PD, a substrate table WT, and a projection system PS.

The illumination system (illuminator) IL is configured to condition a radiation beam B.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum environment. Any use of the term "projection lens" herein can be considered as synonymous with the more general term "projection system."

The illumination system IL can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam B, such as to create a pattern in a target portion C of the substrate W.

It should be noted that the pattern imparted to the radiation beam B may not exactly correspond to the desired pattern in the target portion C of the substrate W, for example if the pattern includes phase-shifting features or so called assist features. Similarly, the pattern eventually generated on the substrate W may not correspond to the pattern formed at any one instant on the array of individually controllable elements. This can be the case in an arrangement in which the eventual pattern formed on each part of the substrate is built up over a given period of time or a given number of exposures, during which the pattern on the array of individually controllable elements and/or the relative position of the substrate changes.

Generally, the pattern created on the target portion C of the substrate W will correspond to a particular functional layer in a device being created in the target portion C, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

A pattern formed by patterning device PD is programmable with the aid of a pattern controller PC, e.g., an electronic means, such as a computer, through transmission of control signals CS transmitted from pattern controller PC to patterning device PD. The control signals CS are generated by pattern controller PC based on one or more of received virtual pattern data VPD, patterning device data PDD, and/or measured signal or data ml (signal(s) and data are used interchangeably throughout) from a measuring system MS I that measures optical characteristics of projection system PS. It is to be appreciated the virtual pattern data VPD and patterning device data PDD could be stored directly in pattern controller PC, and be received as a single data stream or the like based on an application of the lithography system.

Virtual pattern data VPD can be data that represents an image of an ideal or desired mask pattern to be formed on patterning device PD through controlling of the individually controllable elements of the patterning device PD. Additionally, or alternatively, pattern device data PDD can be data that represents known or measured patterning device characteristics (e.g., voltage to tilt angle parameters, dead pixel locations, amplitude and phase coupling response curves, position drift, etc.), for example calibration-based characteristics, regarding a specific patterning device PD being used.

The virtual pattern data VPD can be altered or manipulated, as described in more detail below with respect to FIGS. 5 and 6, based on measured signal m1 that includes information corresponding to measured aberrations and/or distortions in the image of the projection system PS. The aberrations or distortions in the image can be caused by imperfections (e.g., surface imperfections, alignment imperfections, etc.) in the optics within projection system PS. Based on this measured signal m1, pattern controller PC can adjust pattern data for any distortions and/or aberrations caused by the optics of the projection system PS. Then, the control signals CS can be altered based on the measured signal m1.

Pattern controller PC can receive measured signal or data m2 from a second measuring system MS2, which measures optical characteristics of illumination system IL. The measured signal m2 from the second measuring system MS2 can also contribute to (e.g., be used to alter) the characteristics of control signals CS. For example, the measured signal m2 can be used to correct for intensity non-uniformity in the illumination light B. Illumination light B interacting with patterning device PD, depending on illuminator design and manufacturing limitations, can have non uniformities in one or both of an illumination field and pupil. In the field this presents itself as a non-uniform level of light, e.g., patchy, bright, and dark spots. If a map of bright and dark spots is measured by second measuring system MS2 and generated in measured signal M2, then a graytone map in rasterization, i.e., the control signals CS, generated by pattern controller PC can be used to flatten out the field and make it uniform. For example, the pattern data can be altered to attenuate bright spots to match dark spots.

If the illuminator pupil does not exhibit a balanced pole so light is not evenly distributed, this can cause distortion in the image of the projection system PS. Thus, if the pupil shape of illuminator IL is not uniform, the pattern controller PC can use an algorithm to produce control signals CS that compensate for this, resulting in a desired image in the projection system PS.

One or both measuring systems MS1 and MS2 can be a one or two dimensional sensor or detector (e.g., a photosensor, a photodetector, a CCD sensor, a CMOS sensor, or the like, hereinafter all are referred to as sensors) that receives images or light beams from, respectively, projection system PS or illumination system IL. The sensor converts the received light beam intensity and other optical characteristics into electric signals that correspond to the optical characteristics. It is to be appreciated that different types of sensors used for measuring aberrations and/or distortions would become apparent to a skilled artisan upon reading and understanding this description, and all are contemplated within the scope of the present invention.

Measuring system MS1 and/or MS2 can be comprised of multiple measuring devices, each one imaging different portions of a measuring plane. Either measuring devices MS1 and/or MS2 or pattern controller PC can accumulate and correlate all the data across the measuring plane in order to make appropriate alterations and manipulations of the pattern data.

Measuring systems MS1 and/or MS2 can also be used to detect barometric pressure, temperature, and other environmental changes. These changes can effect the images formed in the projection system PS. For example, barometric pressure, or pressure in general, can effect the magnification of an optical system through changing the index of refraction characteristics of gas formed between optical elements in the projection system PS. The change in magnification can cause distortion in an image. Thus, through detection of these environmental changes, the measured signal m1 and m2 can be used by pattern controller PC to alter the pattern data.

The patterning device PD can comprise, but is not limited to, a plurality of programmable elements (e.g., all the devices mentioned in the previous sentence except for the reticle), collectively referred to herein as "contrast devices." The patterning device comprises at least 10, at least 100, at least 1,000, at least 10,000, at least 100,000, at least 1,000,000, at least 10,000,000, or at least 100,000,000 programmable elements.

One embodiment of a programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can instead filter out the diffracted light, leaving the undiffracted light to reach the substrate.

Another embodiment is an array of diffractive optical MEMS devices (micro-electro-mechanical system devices) can also be used in a corresponding manner. A diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors. In this manner, the reflected beam can be patterned according to the addressing pattern of the matrix-addressable mirrors. The required matrix addressing can be performed using suitable electronic means.

For this embodiment, it should be noted that the tilt mirrors may or may not have a "phase-step", where one-half of the mirror surface is at a different height than the other half, such that the height difference is a quarter of the wavelength of the illumination light used in the lithographic system.

Without a phase-step, the mirror has full reflectance into the entrance pupil of the projection lens when commanded to the flat position (i.e. full bright). With the presence of a phase-step, full interference occurs when the mirror is commanded to the flat position (i.e. full dark).

A still further alternative example of a programmable mirror array employs a matrix arrangement of tiny mirrors, each of which can be individually pistoned relative to the nominal optical surface by applying a suitable localized electric field, or by employing piezoelectric actuation means. Such piston mirrors may provide desirable control as individually controllable elements in patterning device PD since they can independently control amplitude and phase of a formed image. Thus, if some aberrations and distortions are caused by phase errors in the projection system, these piston mirrors can correct for the error, and not just amplitude based errors as some other devices may be limited to.

Another example PD is a programmable LCD array. The LCD array can be configured to either transmit incident light or to reflect it.

Another example PD is a digital micro-mirror device (DMD).

The lithographic apparatus can comprise one or more contrast devices.

For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

The substrate W can have a substantially circular shape, optionally with a notch and/or a flattened edge along part of its perimeter. The substrate could alternatively have a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. In other examples, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least 1 side, at least 2 sides or at least 3 sides, of the substrate has a length of at least 5 cm, at least 25 cm, at least 50 cm, at least 100 cm, at least 150 cm, at least 200 cm, or at least 250 cm. At least one side of the substrate has a length of at most 1000 cm, at most 750 cm, at most 500 cm, at most 350 cm, at most 250 cm, at most 150 cm, or at most 75 cm.

In one embodiment, the substrate W is a wafer, for instance a semiconductor wafer. The wafer material may be selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend on the substrate material and/or the substrate dimensions. The thickness is at least 50 µm, at least 100 µm, at least 200 µm, at least 300 µm, at least 400 µm, at least 500 µm, or at least 600 µm. Alternatively, the thickness of the substrate may be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. The array of focusing elements (e.g., MLA) may comprise at least 10 focus elements, at least 100 focus elements, at least 1,000 focus elements, at least 10,000 focus elements, at least 100,000 focus elements, or at least 1,000,000 focus elements. The number of individually controllable elements in the patterning device may be equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. The MLA can be movable (e.g., with the use of one or more actuators) at least in the direction to and away from the substrate. Being able to move the MLA to and away from the substrate allows for focus adjustment without having to move the substrate.

Figure 2:
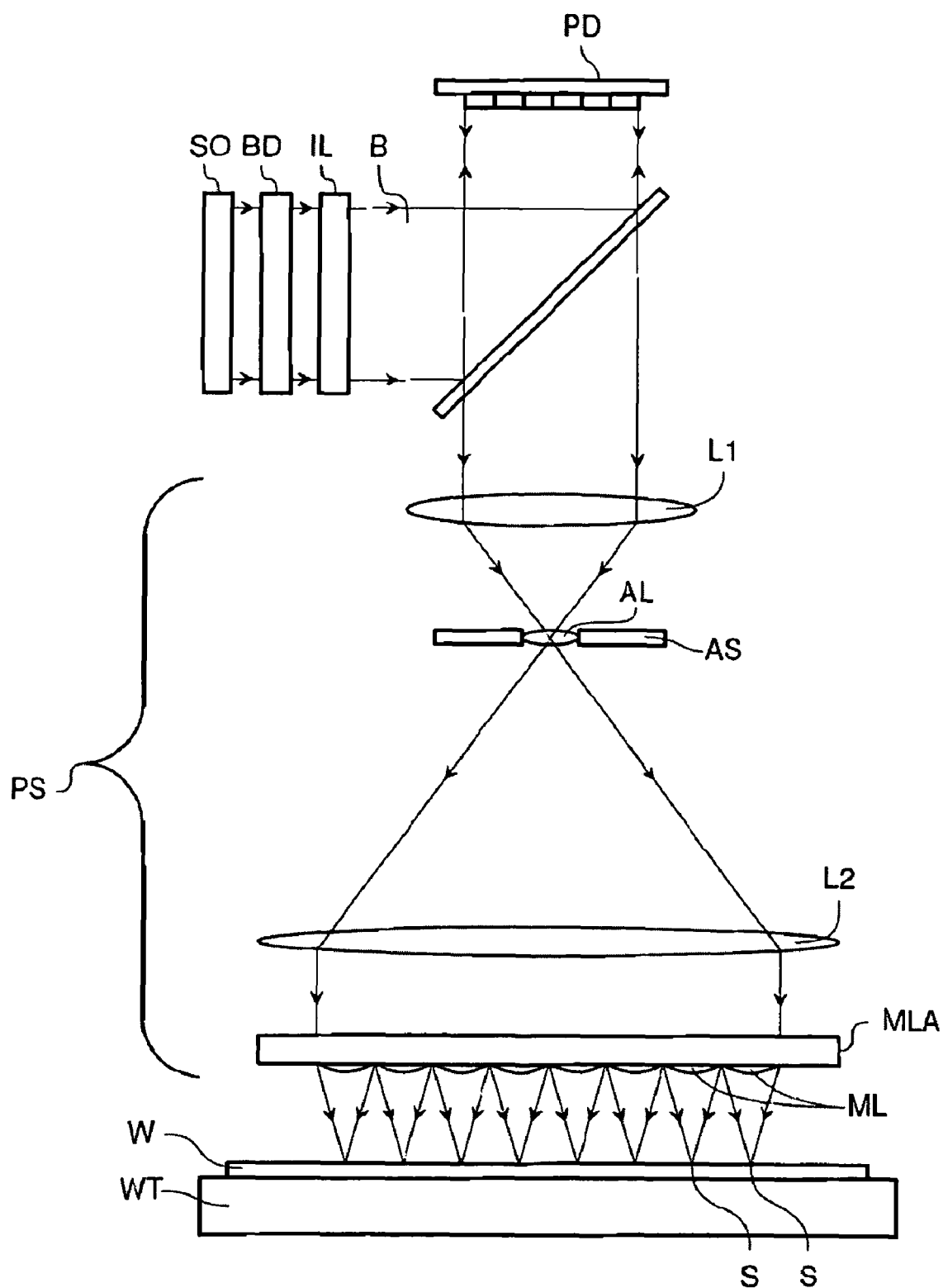

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation has a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B during a scan.

Movement of the substrate table WT can be realized with the aid of a long-stroke module (coarse positioning) and a short-stroke module (fine positioning), which are not explicitly depicted in FIG. 1. In one example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation is directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. The spot size can be larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least three different radiation intensity values, at least 4 radiation intensity values, at least 8 radiation intensity values, at least 16 radiation intensity values, at least 32 radiation intensity values, at least 64 radiation intensity values, at least 128 radiation intensity values, at least 256 radiation intensity values, at least 512 radiation intensity values, or at least 1024 radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
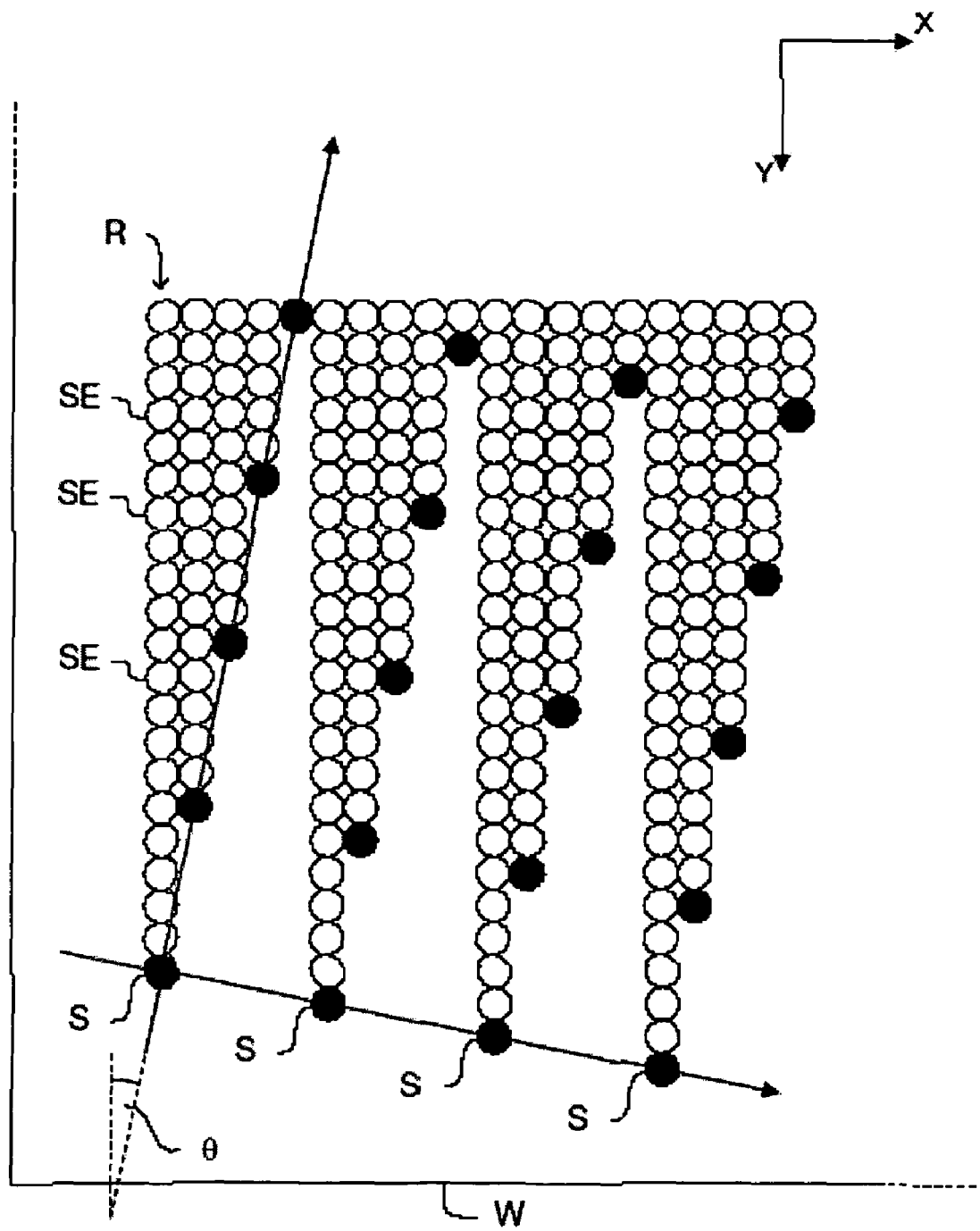
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ is at most 20°, at most 10°, at most 5°, at most 3°, at most 1°, at most 0.5°, at most 0.25°, at most 0.10°, at most 0.05°, or at most 0.01°. The angle θ is at least 0.001°.

Figure 4:
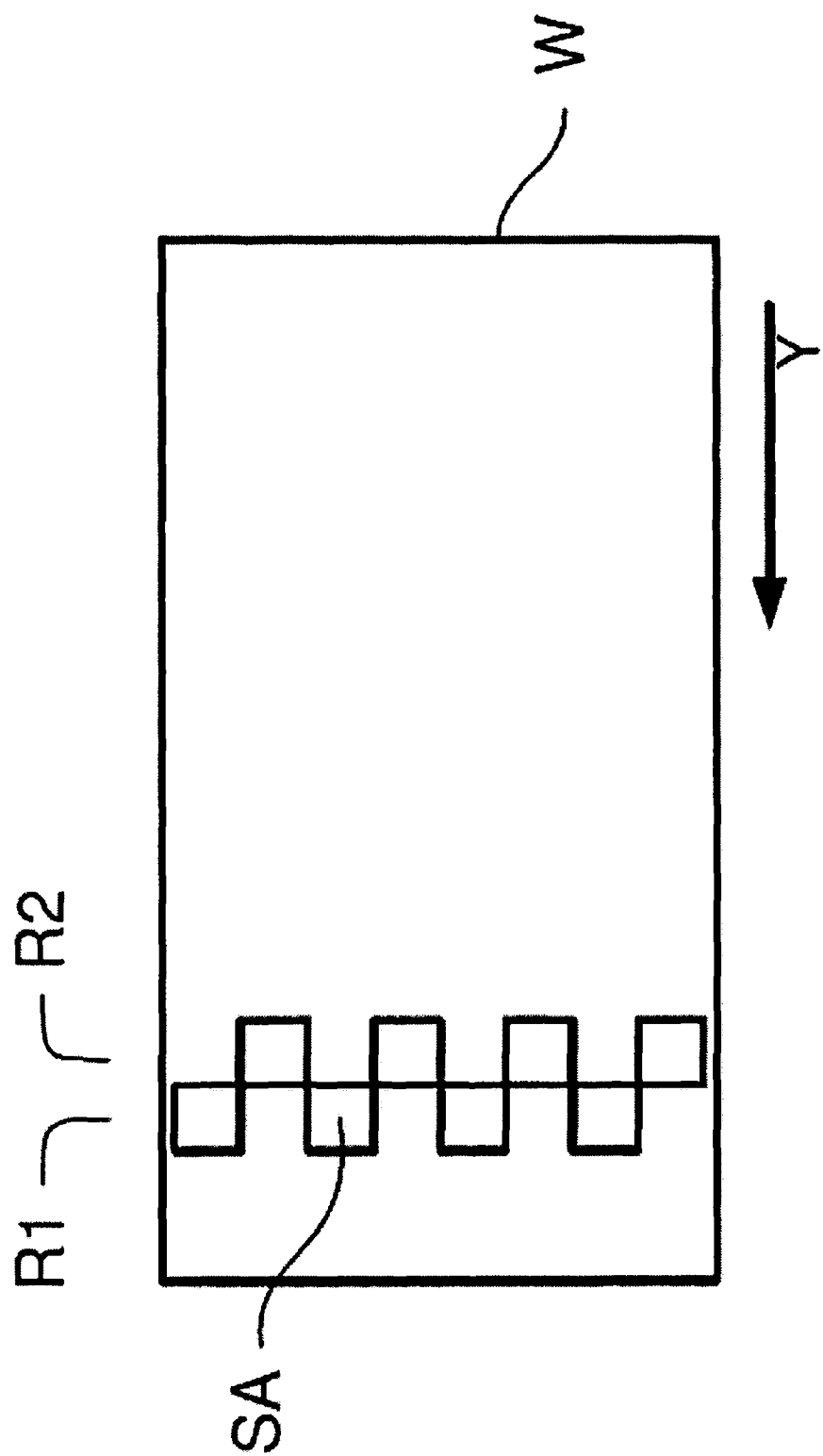
FIG. 4 depicts an arrangement of optical engines.

FIG. 4 shows schematically how an entire substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. The optical engines may be arranged in at least 3 rows, at least 4 rows or at least 5 rows. In this way, a band of radiation extends across the width of the substrate W, allowing exposure of the entire substrate to be performed in a single scan. It will be appreciated that any suitable number of optical engines can be used. The number of optical engines is at least 1, at least 2, at least 4, at least 8, at least 10, at least 12, at least 14, or at least 17. The number of optical engines may be less than 40, less than 30, or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Optical Maskless Lithography System and Method

Figure 5:
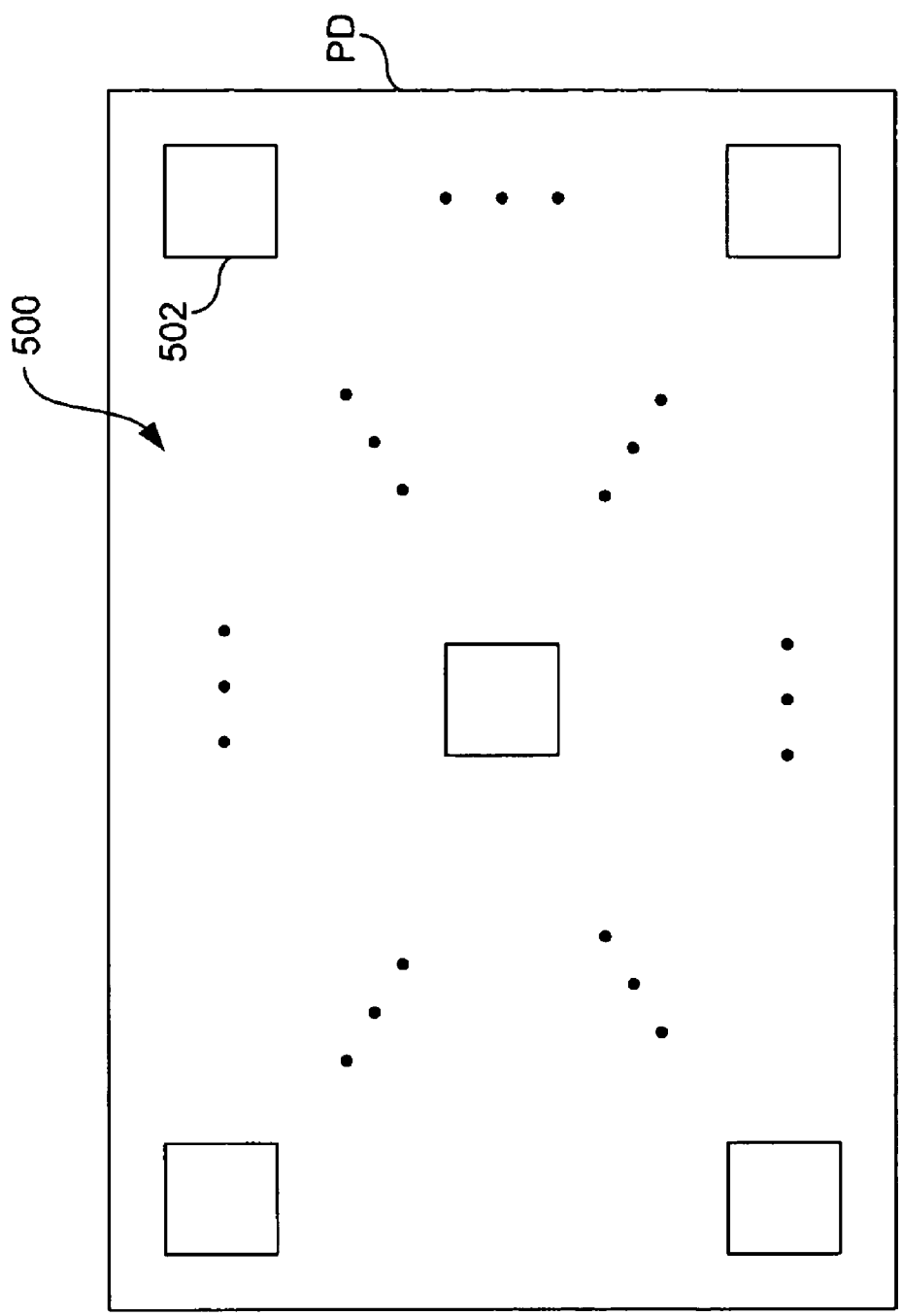
FIG. 5 shows a spatial light modulator.

FIG. 5 shows details of an active area 500 of patterning device PD. Active area 500 includes an array of active devices 502 (represented by dotted patterns in the figure). Active devices 502 can be mirrors on a micro-mirror device, such as a DMD, or locations on a LCD. It is to be appreciated that active devices 502 can also be referred to as pixels, as is known in the relevant art. By adjusting the physical characteristics of active devices 502, they can be seen as being either ON or OFF. Digital or analog input signals based on a desired pattern are used to turn ON and OFF various active devices 502. In some embodiments, an actual pattern being written to substrate W can be detected and a determination can be made whether the pattern is outside an acceptable tolerance. If so, pattern controller PC can be used to generate analog or digital control signals in real time to fine-tune (e.g., calibrate, adjust, etc.) the pattern being generated by patterning device PD.

Figure 6:
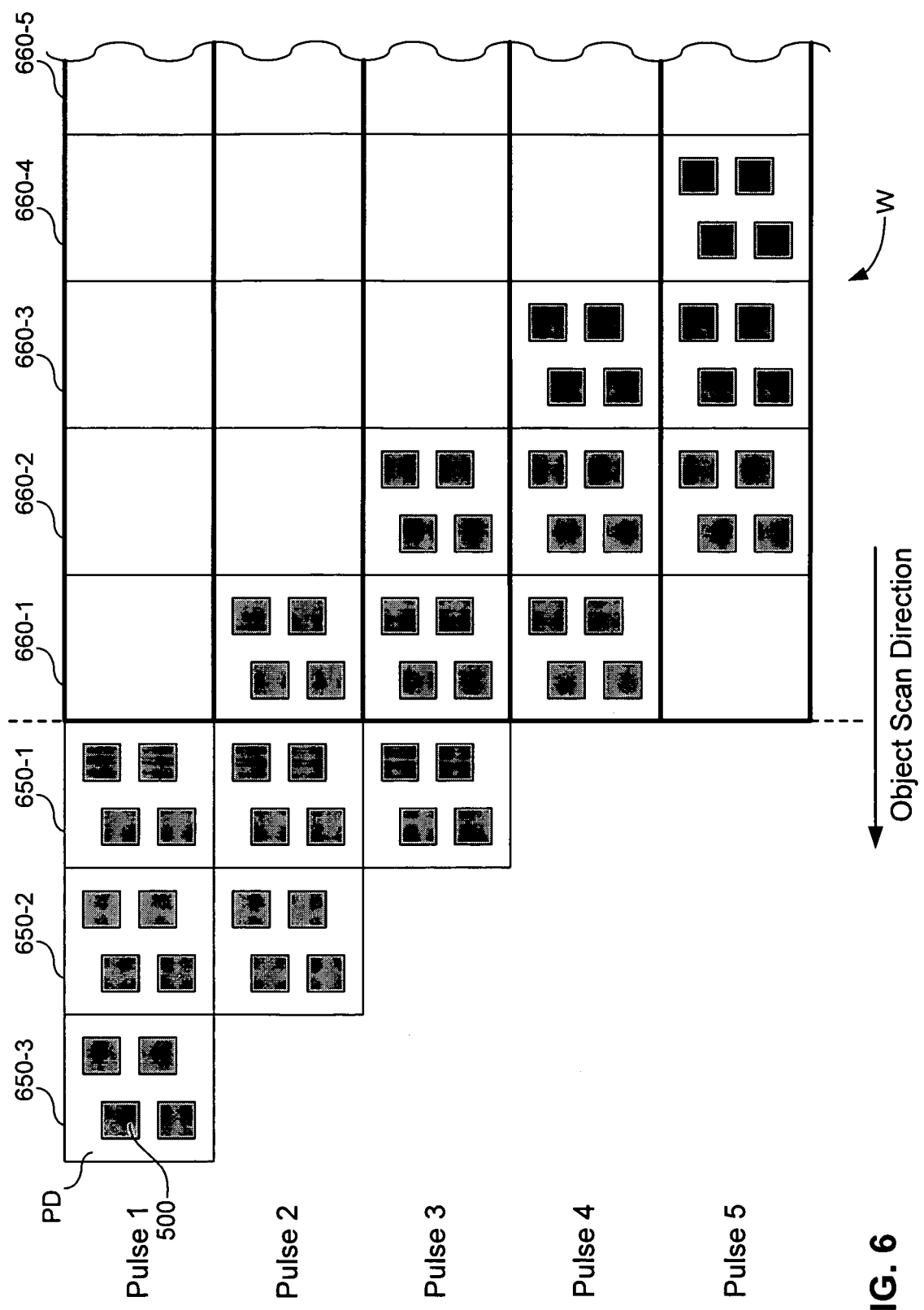
FIGS. 6 and 7 show an exposure diagram for sequential pulses of light from an illumination source.

FIG. 6 is one example of an exposure diagram for three sections 650 of an array having four patterning devices PD per section as they write to a same row of exposure areas 660 on substrate W during five pulses of light. Sections 650-1 and 650-3 can be part of a first (e.g., leading) set of patterning devices PD and Section 650-2 can be part of a second (e.g., trailing) set of patterning devices PD. This exposure diagram is shown from the perspective of substrate W as it is moving in the direction of the arrow with an equivalent step of two widths of active areas 500 per light pulse. During Pulse 1, the array has not overlapped object 112. During Pulse 2, a pattern generated by the array for Patterning devices PD 104 in a first section 650-1 is written to a first exposure area 660-1. During Pulse 3, either the same or a different pattern is written to exposure area 660-1 by section 650-2 and either the same or different pattern is written to exposure area 660-2 by section 650-1. Thus, the trailing set in section 650-2 writes over a same exposure area 660-1 later in time as the leading set in section 650-1. This general exposure process is repeated for Pulses 4 and 5, as is shown.

Figure 7:
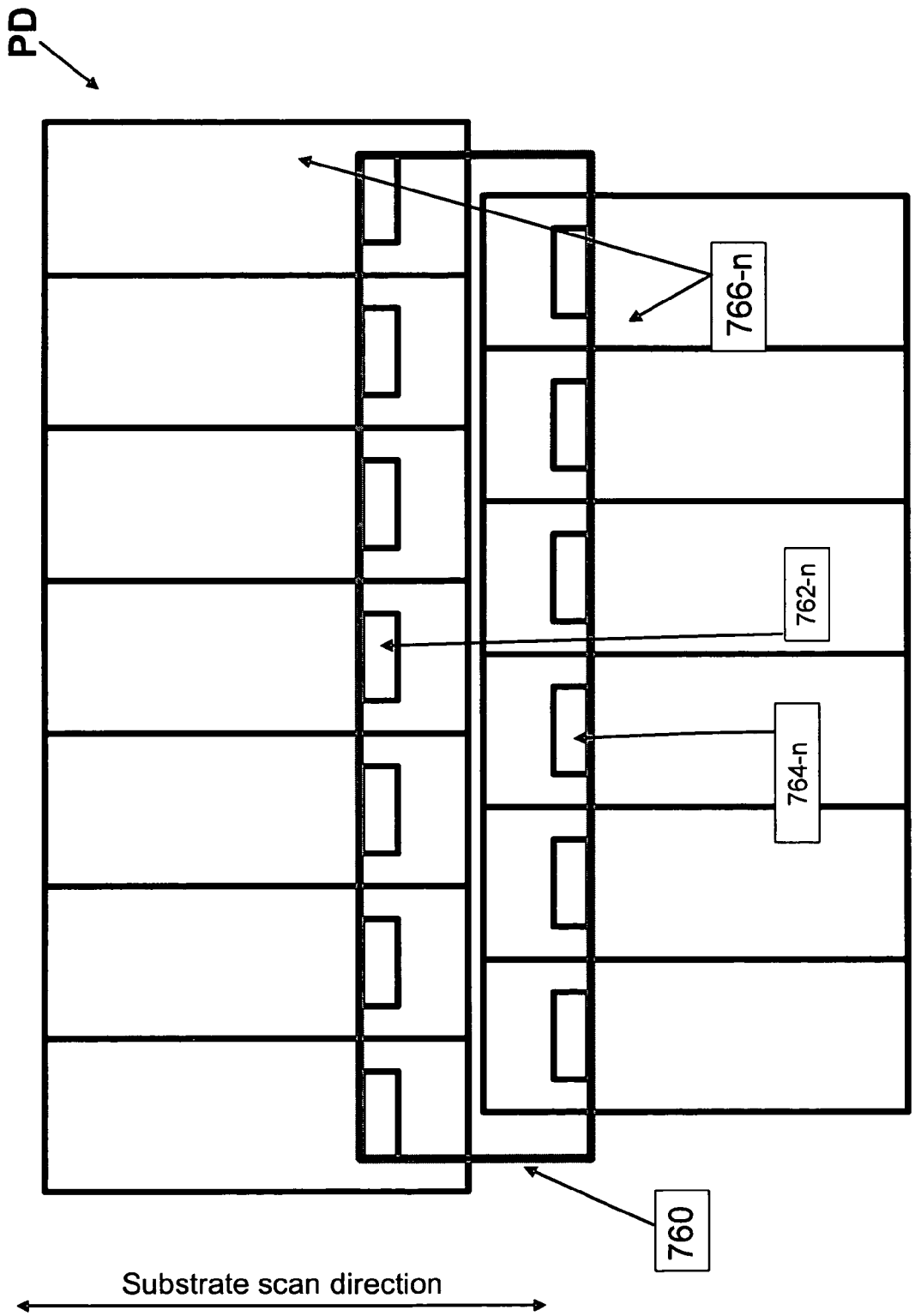

FIG. 7 shows an alternative embodiment of a set of patterning devices PD. Patterning device PD has an optical field area 760, a top column of micro-mirror devices 762-n, and a bottom column of active micro-mirror device 764-n, where each of the micro-mirror devices 762-n and 764-n have mechanical and electrical device mounting support areas 766-n. The alignment of the active mirror areas of the individual micro-mirror devices 760 in the top column are aligned to fill in the spaces between the active mirror areas of the individual micro-mirror devices 762 in the lower column. During successive pulse exposure a continuous stripe is written across a substrate W (not shown) while the substrate W is moving the distance of one active mirror area width between pulses. Multiple pulse exposure for any particular spot on the substrate W, either at the same or at different energy levels, can be achieved by repeating more passes over the same portion of the substrate W, such that any particular spot on the substrate W receives as many pulses as passes over the substrate W.

It is to be appreciated this is a very simple example of the exposure process that can occur using an array of patterning devices PD in a maskless lithography system. It is being used to demonstrate how using an array of patterning devices PD allows for multiple exposures in each exposure area 660 during each scan period, which increases throughput compared to a conventional system using one patterning device PD.

Exemplary Rasterization Process

As discussed above, one of the main challenges in maskless lithography is to understand how best to control the individually controllable elements (e.g., pixels) of the patterning device PD to pattern an incoming beam of radiation, such that the patterned beam reproduces a desired pattern on a substrate (or in a pupil of the projection system PS). Several approaches to maskless rasterization can be utilized.

One such approach is image optimization. Image optimization performs iterations of the pixel states to optimally print a desired pattern, while accounting for feature proximity effects and optical interference between the pixels. On a conceptual level, this approach follows many techniques utilized for optical proximity effect correction (OPC) features designed for traditional masks. Another optical rasterization technique is referred to as global optimization rasterization. This technique includes matching the pupil field generated by the given mask, and taking into account the constraints dictated by the modulation principle of the patterning device PD. However, neither of these techniques takes into consideration the optical characteristics (e.g., optical errors) of projection system PS and/or illuminator IL.

In order to form the required pattern on the substrate W, it is necessary to set each of the individually controllable elements in the patterning device PD to the requisite state at each stage during the exposure process. Therefore, control signals CS, representing the requisite states, must be transmitted to each of the individually controllable elements. For example, as discussed above with respect to FIG. 1. The lithographic apparatus uses the pattern controller PC to generate and transmit the control signals CS to the patterning device PD. The pattern to be formed on the substrate W can be provided to the lithographic apparatus in a vector-defined format, such as GDSII. In order to convert the design information (e.g., virtual pattern data VPD) into the control signals CS for each individually controllable element, the pattern controller PC can include one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

Figure 8:
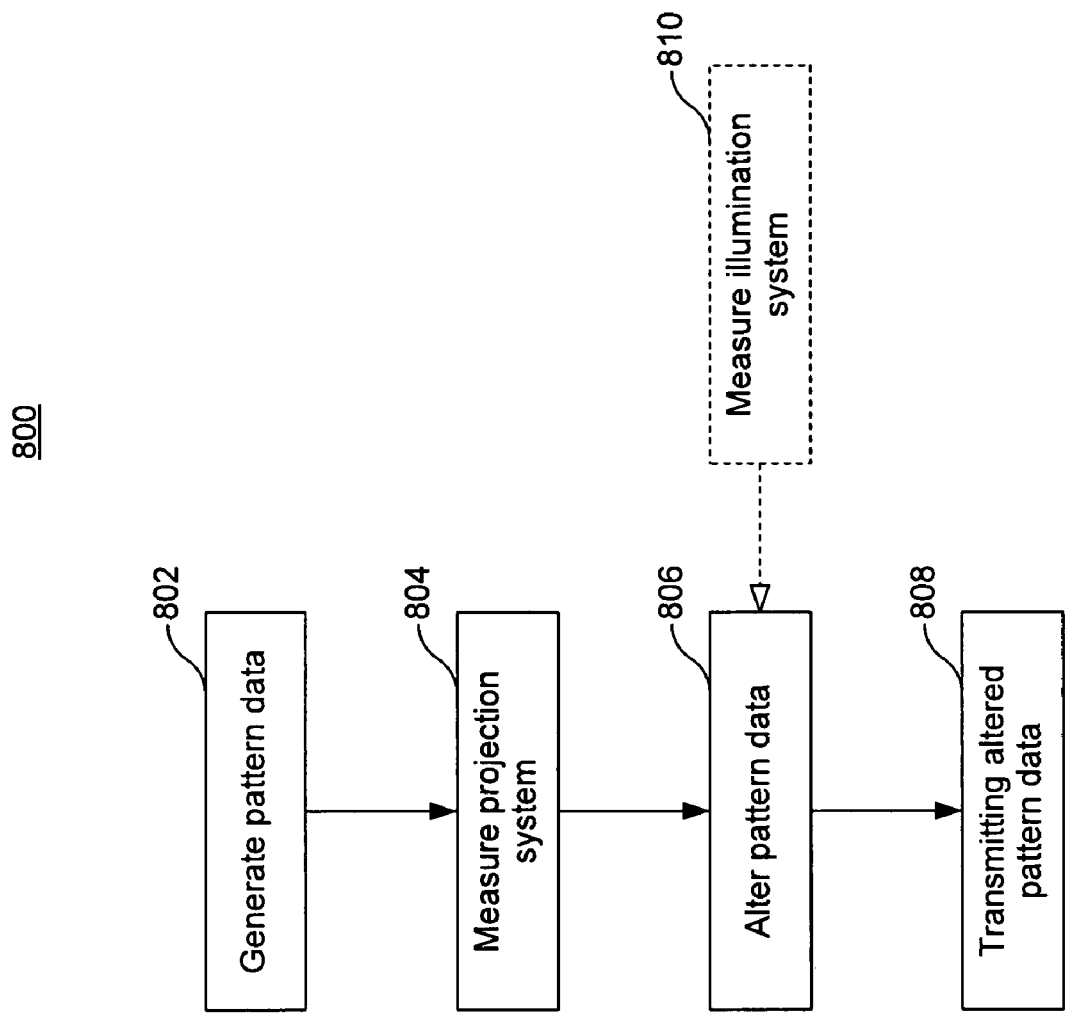
FIGS. 8 and 9 show various process flow diagrams showing various control signal generation methods.

FIG. 8 is a process flow diagram showing a control signal generation method 800, according to one embodiment of the present invention.

In step 802, pattern data is generated corresponding to features to be formed on a substrate. For example, the pattern data can be the virtual pattern data VPD or a combination of the virtual pattern data VPD and the pattern device data PDD.

In step 804, aberrations and/or distortions of a projection system PS are measured. For example, measured signal m1 is generated using measuring system MS1 in FIG. 1, as discussed above.

In step 806, the pattern data is altered based on the measured signal. For example, the pattern controller PC can receive the measured signal m1 and use it to alter the pattern data.

In step 808, the altered pattern data is transmitted to a patterning device PD to control individually controllable elements coupled to the patterning device. For example, the control signals CS can be transmitted to the patterning device PD.

Before step 808, in step 810 non uniformities in one or both of an illumination field and pupil of an illumination system can be measured. For example, measurements can be made using measuring system MS2 in FIG. 2, as described above. Such non-uniformity measurements may also include speckle patterns caused by interactions between the illumination source and the illuminator optics. For example, lithography systems may use lasers as radiation sources to produce an illumination beam, e.g., a coherent illumination beam or a partially coherent illumination beam. During its travel through the lithography system, the illumination beam may reflect from components in the lithography system, which can form scattered light. The scattered light can interfere with the illuminating beam causing speckle patterns in an image. The speckle patterns are undesirable because they can cause errors in a pattern formed on a substrate. The speckle patterns can be caused by interference of partially coherent beams that are subject to minute temporal and spatial fluctuations. The speckle patterns are sometimes referred to as noise-like characteristics of the (partial) coherent illumination beam. Speckle patterns can also be caused when an element that increases angular distribution is used because multiple coherent copies of the beam are made. The multiple coherent copies of the beam can interfere with each other when an optical path difference between the different coherent copies (e.g., between generation of the beams and detection of the beams) is small compared to a coherence length (e.g., transverse and temporal) of the beams.

In step 806, the pattern data can be further altered based on the measured signal m2 generated by measuring system MS2 corresponding to optical characteristics of the illumination system measurements. For example, pattern controller PC can use received measuring signal m2 to alter the pattern data and the control signals, respectively.

Step 804 can comprise measuring the aberrations and/or distortions at an image plane of the projection optical system and transforming measured values to a pupil plane of the projection system.

The measuring and altering steps can take place before an exposure process, periodically, or continuously in real-time.

Figure 9:
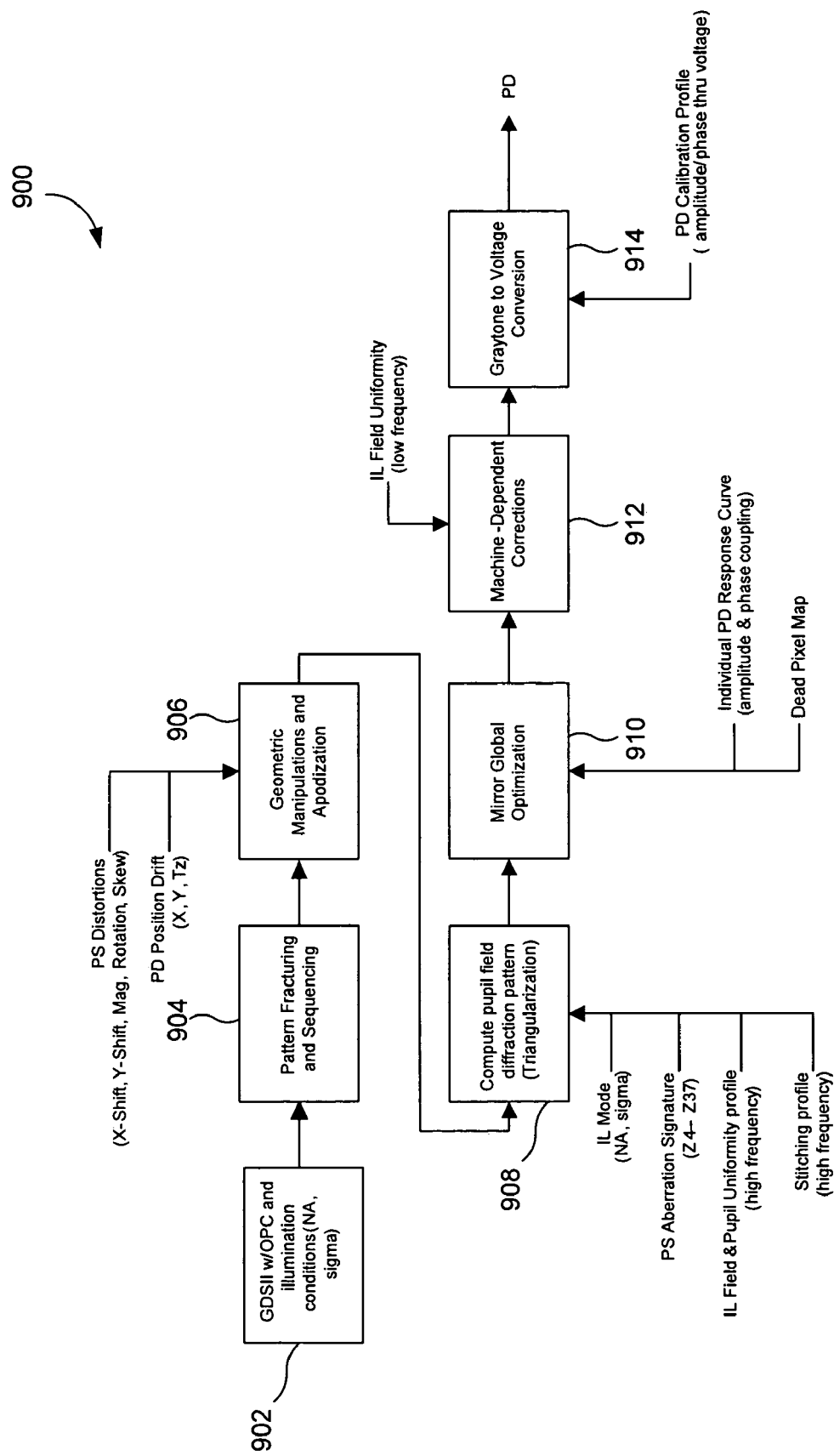

FIG. 9 shows a process flow of a control signal generation method 900, according to one embodiment of the present invention.

In step 902, virtual pattern data VPD (e.g., GDSII data possibly including OPC and illumination characteristics (NA, sigma, etc.) data) is generated.

In step 904, pattern fracturing and sequencing is performed on the virtual pattern data VPD.

In step 906, geometric manipulations and apodization are performed on the virtual pattern data VPD. For example, these manipulations can be based on measured projection system distortions (e.g., based on measuring system MSI) and patterning device PD characteristics (e.g., patterning device data PDD, etc.), as discussed above.

In step 908, a pupil field and diffraction pattern is computed. For example, the computations can use triangularization techniques. Additionally, or alternatively, the computations can take into account illumination system IL characteristics (e.g., NA, sigma, etc.), projection system aberration in measured signal m1 as generated by measuring system MS1, measured illumination system characteristics (e.g., field and pupil uniformity profile, such as high frequency aspects) in measuring signal m2 generated by measuring system MS2, and stitching profiles.

In step 910, global optimization is performed on the patterning device PD. For example, this can be based on patterning device data PDD (e.g., individually controllable element response curves associated with phase and amplitude coupling, dead pixel maps, etc.).

In step 912, machine dependent corrections can be made. For example, alternations based on illumination system IL field uniformity and/or speckle patterns, taking account of low frequency errors, which can be part of measured signal M2 generated by measuring system MS2.

In step 914, graytone to voltage conversion is performed. For example, pattern device data PDD can be used, such as patterning device PD calibration profile related to amplitude and phase through voltage. This generates the control signal CS that is transmitted to the patterning device PD.

Through the processes described in FIGS. 8 and 9, any aberrations or distortions in the physical devices and layouts in the optics of the projection system PS and/or one or both of field or pupil non uniformities in the illumination system IL can be measured and compensated for. This can be done by measuring the optical characteristics in the projection system PS and/or the illumination system IL using respective measuring devices MS1 and MS2. The respective signals m1 and m2 from these measuring devices MS1 and MS2 are transmitted to pattern controller PC. The pattern controller uses the signals m1 and/or m2 to manipulate or alter the pattern data (virtual pattern data VPD and/or patterning device data PDD) to reverse the errors in the image formed at the pupil of the projection and/or illumination system.

Through altering of the pattern data through measurement data, high frequency aberrations can be corrected. Previously, most higher order aberrations or higher order Zernike terms, which can be caused by e.g surface quality of the optical elements, were adjusted for by correcting the surface of one or more optics directly. This adjustment was performed by various means, e.g. use of deformable optical elements, refiguring particular optical elements, etc. However, even with this physical correction, any high frequency astigmatism near the lens was not readily correctable. Thus, through manipulation of the pattern data, these higher order errors can be corrected. Also, low order Zernike terms and distortions can be corrected as discussed above.

The corrections can take place during a calibration process of the system, initially and/or periodically, or during the exposure process itself in real-time. If performed initially and/or periodically, only static errors that do not change over time, or change slowly enough over time that they are essentially constant during the exposure of one or more substrates, can be compensated for with this technique. If correction is to be performed in real-time, sufficient computational resources would be required in the datapath to perform the computations necessary to predict and/or track dynamic changes to the aberrations and/or distortions of the projection lens, and/or similarly dynamic changes to the illumination pupil field profile and/or the field uniformity of the illumination in real-time, as well as compute and apply the requisite compensation profile to the dynamically-generated pattern.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method, comprising:
   (a) generating pattern data corresponding to features to be formed on a substrate using a patterning device;
   (b) measuring, during the patterning of the substrate using the patterning device at least one of aberrations and distortions of a projection system;
   (c) feeding back the measured at least one of aberrations and distortions to perform altering of the pattern data;
   (d) measuring imperfections in a pupil of an illumination system that provides illumination radiation to the patterning device; and
   (e) altering the pattern data based on the illumination system measuring.

2. The method of claim 1, wherein:
   step (b) comprises measuring the at least one of aberrations and distortions of the projection system; and
   step (c) comprises altering the pattern data to form an image free from the at least one of measured aberrations and distortions.

3. The method of claim 1, further comprising transmitting the altered pattern data to the patterning device to control individually controllable elements, wherein the patterning device comprises a digitally controlled array of micro-mirrors having multiple mirror positions as the individually controllable elements.

4. The method of claim 1, wherein an amplitude and a phase of the image is controlled through control of the patterning device.

5. The method of claim 1, wherein step (b) further comprises measuring at least one of barometric pressure and temperature of the projection system.

6. The method of claim 1, wherein step (c) further comprises compensating for high frequency ones of the at least one of aberrations and distortions caused by a surface imperfection on one or more optical elements in the projection system.

7. The method of claim 1, wherein steps (b)-(c) compensate for at least one of dynamic and static ones of the at least one of aberrations and distortions.

8. The method of claim 1, wherein:
   step (b) comprises measuring the at least one of aberrations and distortions at an image plane of the projection optical system and transforming measured values to a pupil plane of the projection system; and
   step (c) comprises altering the pattern data to form an image at the pupil plane and the image plane free from the at least one of measured aberrations and distortions.

9. The method of claim 1, wherein step (b) comprises combining multiple measurements taken from different portions of an image plane.

10. The method of claim 1, further comprising after step (c):
    measuring non-uniformities in a field of the illumination system that provides illumination radiation to the patterning device; and
    altering the pattern data based on the measuring of the non-uniformities.

11. The method of claim 1, further comprising after step (c):
 measuring a speckle pattern of the illumination system that provides illumination radiation to the patterning device; and
 altering the pattern data based on the measuring of the speckle pattern.

12. The method of claim 1, further comprising after step (c):
 measuring non-uniformities in a field and imperfections in a pupil of the illumination system that provides illumination radiation to the patterning device; and
 altering the pattern data based on the measuring the non-uniformities.

13. The method of claim 1, wherein:
 step (b) comprises measuring the at least one of aberrations and distortions at an image plane of the projection optical system; and
 step(c) comprises altering the pattern data to form an image at the image plane free from the at least one of measured aberrations and distortion.

14. A lithographic system, comprising:
 an illumination system configured to process a beam of radiation;
 a patterning device including a controller and an array of individually controllable elements, the controller being configured to control the array of individually controllable elements based on received pattern data to pattern the beam of radiation;
 a projection system configured to project the patterned beam onto a target portion of a substrate;
 a first measuring system configured to measure at least one of aberrations or distortions of the projection system; and
 a second measuring system configured to measure imperfections in a pupil of the illumination system configured to provide illumination radiation to the patterning device,
 wherein the controller is configured to use the measured at least one of aberrations or distortions or imperfections to alter the pattern data, and
 wherein the imperfections comprise a surface or an alignment imperfection.

15. The lithography system of claim 14, wherein:
 the first measuring system is configured to measure the at least one of aberrations and distortions of the projection system; and
 the controller is configured to alter the pattern data to form an image at the pupil plane free from the at least one of measured aberrations and distortions.

16. The lithography system of claim 14, wherein the array of individually controllable elements comprises a digitally controlled array of micro-mirrors having multiple mirror positions.

17. The lithography system of claim 14, wherein the controller is configured to control the patterning device to adjust an amplitude and a phase of the patterned beam.

18. The lithography system of claim 14, wherein:
 the at least one of the first or second measuring system is configured to measure at least one of barometric pressure and temperature of the projection system; and
 the controller is configured to use the at least one of barometric pressure and temperature to alter the pattern data.

19. The lithography system of claim 14, wherein the controller is configured to compensate for high frequency ones of the at least one of aberrations and distortions caused by a surface imperfection on one or more optical elements in the projection system.

20. The lithography system of claim 14, wherein the at least one of the first or second measuring system and the controller are configured to periodically alter the pattern data.

21. The lithography system of claim 14, wherein the at least one of the first or second measuring system and the controller are configured to alter the pattern data.

22. The lithography system of claim 14, wherein the first measuring system and the controller are configured to compensate for at least one of dynamic and static ones of the at least one of aberrations and distortions.

23. The lithography system of claim 14, wherein:
 the first measuring system is configured to measure the at least one of aberrations and distortions at an image plane of the projection system and transform measured values to a pupil plane of the projection system; and
 the controller is configured to alter the pattern data to form an image at the pupil plane and the image plane free from the at least one of measured aberrations and distortions.

24. The lithography system of claim 14, wherein the at least one of the first or second measuring systems is configured to combine multiple measurements taken from different points of a measuring plane.

25. The lithography system of claim 24, wherein the at least one of the first or second measuring system comprises a plurality of measuring devices, each corresponding to one of the different portions of the measuring plane.

26. The lithography system of claim 14, wherein:
 the second measuring system is configured to measure non-unifoimities in a field of the illumination system configured to provide illumination radiation to the patterning device; and
 the controller is configured to alter the pattern data based on the measured field of the illumination system.

27. The lithography system of claim 14, wherein:
 the at least one of the first or second measuring system is configured to measure a speckle profile from an illumination system configured to provide illumination radiation to the patterning device; and
 the controller is configured to alter the pattern data based on the measured speckle profile of the illumination system.

28. The lithography system of claim 14, wherein:
 the second measuring system is configured to measure non-uniformities in a field and imperfections in a pupil of an illumination system configured to provide illumination radiation to the patterning device; and
 the controller is configured to alter the pattern data based on the measured field and the measured pupil of the illumination system.

29. The lithography system of claim 14, wherein:
 the first measuring system is configured to measure the at least one of aberrations and distortions at an image plane of the projection system; and
 the controller is configured to alter the pattern data to form an image at the image plane free from at least one of measured aberration and distortions.

30. The system of claim 14, wherein the imperfections comprise a non-uniformity of the beam or a misshaped illumination profile.

31. A method, comprising:

measuring, during patterning of a substrate, imperfections in a pupil of an illumination system configured to provide radiation to a patterning device that patterns the substrate based on received patterning data; and measuring, during the patterning of the substrate, at least one of aberrations and distortions of a projection system configured to project the patterned beam onto the substrate;

feeding back the at least one of aberrations and distortions, and the imperfections to perform altering of the pattern data based on the measuring; and transmitting the altered pattern data to a patterning device to control individually controllable elements coupled to the patterning device.

\* \* \* \* \*